United States Patent [19]

Detoma

[11] Patent Number: 4,755,417
[45] Date of Patent: Jul. 5, 1988

[54] METHOD TO ENSURE THE COOLING OF ELECTRONIC COMPONENTS FIXED ON A MULTILAYER FOR PRINTED CIRCUITS AND MULTILAYER REALIZED ACCORDING TO SAID METHOD

[75] Inventor: Renzo B. Detoma, Florence, Italy

[73] Assignee: Mas Industriale S.p.A., Pistoia, Italy

[21] Appl. No.: 870,522

[22] Filed: Jun. 4, 1986

[30] Foreign Application Priority Data

Jun. 17, 1985 [IT] Italy .................................. 9428 A/85

[51] Int. Cl.$^4$ .......................... B32B 3/00; H05K 1/00
[52] U.S. Cl. .................................... 428/209; 428/901; 174/68.5
[58] Field of Search ................ 174/68.5; 428/209, 901

[56] References Cited

U.S. PATENT DOCUMENTS 4,432,037 2/1984 Brabetz .............................. 361/410

Primary Examiner—John E. Kittle
Assistant Examiner—Patrick J. Ryan
Attorney, Agent, or Firm—Hopgood, Calimafde, Kalil, Blaustein & Judlowe

[57] ABSTRACT

The method ensures the cooling of electronic components fixed on a multilayer, with at least a metal layer interposed between insulating layers, through successive steps for the obtaining of seats or cavities or through-holes with metallized surface, the seats or cavities having the bottom formed by said metal layer and the through-holes being formed in the vicinity of the same seats; the cooling of the component is achieved by heat conduction along said metal layer, or by dissipator means located outside the multilayer and in thermal conductivity connection with said metal layer.

18 Claims, 4 Drawing Sheets

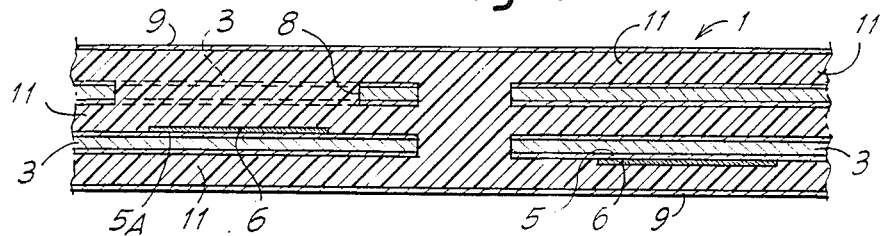
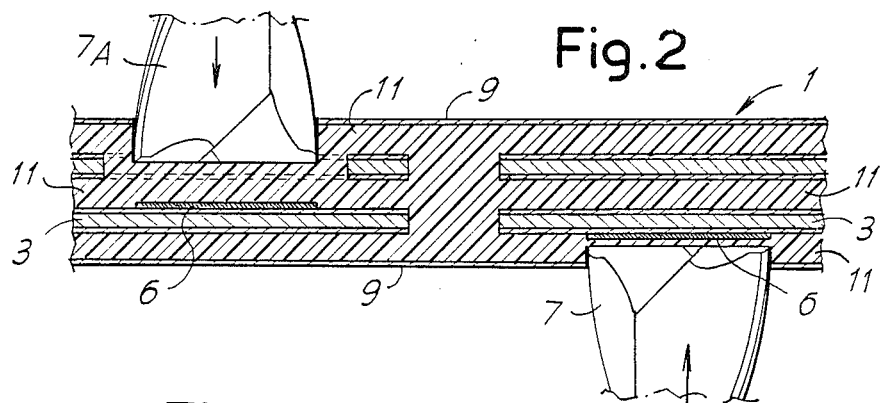
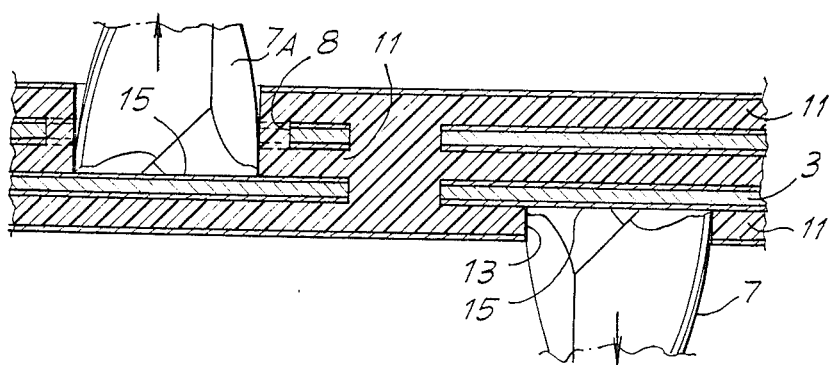
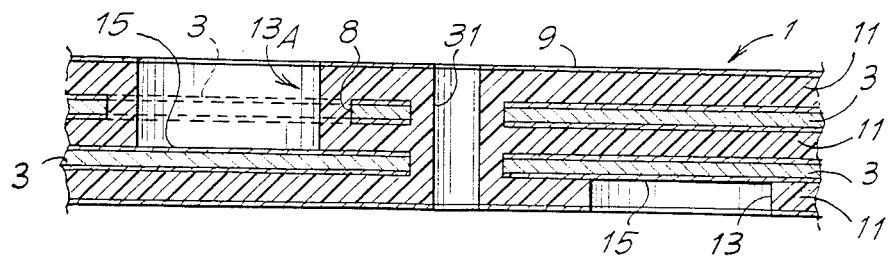

METHOD TO ENSURE THE COOLING OF ELECTRONIC COMPONENTS FIXED ON A MULTILAYER FOR PRINTED CIRCUITS AND MULTILAYER REALIZED ACCORDING TO SAID METHOD

The invention relates to a method to ensure the cooling of electronic components fixed on a multilayer for printed circuits, the multilayer comprising at least a metal layer interposed between insulating layers and, on the outside faces, a copper layer for said circuits; the invention relates also to a multilayer realized according to said method.

According to the invention, the method comprises the steps of:

applying, before the matching of the layers of the multilayer, onto at least one of the faces of the metal layer or of one of the metal layers, a special thin layer or film of insulating or conductive material;

creating, through a milling operation, seats or cavities for the insertion of the base portion of the electronic component and possible other seats for the insertion of heat-dissipating rods, the bottom of said seats being made up of said interposed metal layer, for the removal of said special thin layer by means of the milling cutter;

forming through-holes in the vicinity of said seats for the insertion of the component base and at close distance from the body outside walls of the component which is to be fixed in each seat;

covering, by means of a metallization layer, all the uncovered surfaces of the multilayer, including those of said seats and those inside said through-holes, thereby achieving the electrical and heat transmission connection of all the surfaces covered by the metallization layer;

carrying out—through a photoengraving operation, or in another way, on the face or faces of the multilayer on the side wherein said seats are formed—some areas outlining the same seats for the fixing of the component by welding, as well as other areas for connecting, by welding, the component with the printed circuit, and also metal strips making up the leads of said circuit.

The thin layer or film applied upon the first step is capable of determining an electrical signal which causes the milling cutter to move away—immediately after the removal of the same thin layer, but, in practice, without having indented the metal layer of the multilayer—from the seat it has formed; and the cooling of the component is achieved by heat conduction along said metal layer or by dissipator means located outside the multilayer and in thermal conductivity connection with said metal layer interposed inside the multilayer.

The invention will be better understood by following the description and the attached drawing which shows a practical non limitative exemplification of the invention itself. In the drawing:

FIG. 1 shows a section view of a laminated multilayer realized according to the method of the invention;

FIGS. 2, 3, 4, 5 and 6 are section views illustrating successive phases of said method for the realization of metallized seats and holes for the purposes of the invention;

Figure 5:
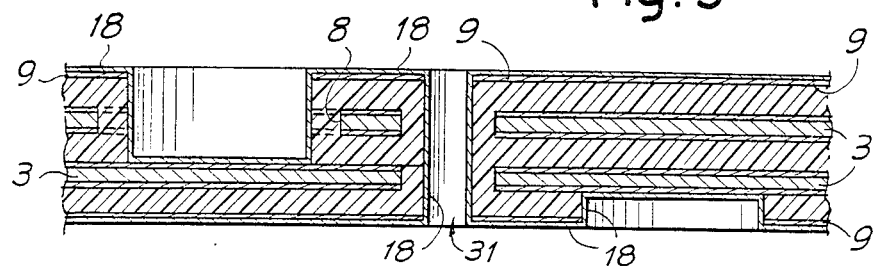

According to the attached drawing, numeral 1 indicates a multilayer laminate or panel, preferably having a very low coefficient of thermal expansion, which is realized on a first step of the method according to the invention. Upon this step, areas 5 and 5A are created on one face of a flat metal layer or element 3, by silk-screen printing or other suitable system, on which areas an insulating or conductive thin layer 6 is in this way applied, capable of determining, when the cutting edges of a milling cutter 7 or 7A come into contact therewith, a signal which causes the cutter to lift immediately after the removal of the same layer 6, that is, after it has uncovered but not indented the metal of layer 3. The layer 6 may be realized in the form of a more or less thin film, usually capable of being easily stripped and made, for example, but not exclusively, of polyimide material being filled or not with extremely fine metal powder; or else, the layer may be constituted by a real electricity conductive metal paste being alloyed with resins being for example but not exclusively, epoxy type resins; in any case, the silk-screen printing process (or other) for the application of the layer 6 may be followed by a phase for the hot-polymerization of the material or of the carrier making part of said layer, in order to achieve a correct anchorage thereof.

The multilayer laminate 1, for the applications falling within the objects of the invention, is usually made up, after the application step of layer 6 on the areas 5 and 5A, of two outer copper layers 9, of at least two but preferably three layers of insulating material 11 and of at least one, but preferably two metal layers 3. The metal layers 3 are usually continuous throughout the multilayer but, according to the circumstances, may exhibit suitable holes 8 or interruptions or be limited to given zones. To obtain a very low coefficient of thermal expansion of the multilayer 1, the layers 11 are usually realized in epoxy resin reinforced with glass fiber cloth, or in polyimide resins reinforced with said cloth; moreover, the interposed metal layers 3 are of "INVAR" alloy or, as shown in the drawing, of a layer of INVAR, together with two upper and lower thin layers of copper. The layers 3 cooperate with the material of the layers 11 to give rise to the maximum dimension stability of the multilayer upon the temperature changes. In the formation of a multilayer, like that indicated by 1 (with or without the areas 5 and 5a covered with a layer 6), relatively very high temperatures occur which the material of the layer 6 must be able to withstand without having its characteristics changed.

In the successive steps—which are the ones for use—seats or dead holes 13 are formed in the multilayer 1 for the fastening of electronic components CE thereon, by means of milling cutters like those indicated by 7 and 7A. The milling operation will be performed by utilizing suitable jigs able to make the drilling coincide with the area 5 or 5A positions. When the cutting edges of the cutters, like those indicated by 7 and 7A, encounter the layer 6—which differs from the layer 11 previously crossed by the cutter—either a sudden change of the cutter rotation speed, or—in case the layer 6 is formed by a conductive paste, being in contact with the layer 3—an electrical contact between the cutter and the layer 6 takes place. In one case or the other, at said sudden speed change or at said electrical contact, an electrical signal can be made to correspond, able to automatically drive the immediate removal of the cutter from the multilayer, substantially at the very moment it has finished cutting out a seat 13 whose bottom wall 15 makes part of the upper surface of one of the metal layers 3, as it is shown in FIGS. 3 and 4. Moreover, as shown in FIGS. 1, 2, 3 and 4, upon the formation of the multilayer 1, when the area 5A finds itself on the metal layer 3 located in a lower position (in the drawing), a hole 8, relatively larger than the area 5A and the corresponding seat 13A realized by the cutter 7A, must be provided on the layer 3 located in a upper position, in order to avoid undesirable contacts.

Further steps for achieving the objects of the invention, that is, for achieving an extremely good dissipation of the heat due to the working of the electronic components CE mounted on the multilayer, are the formation at a suitable position, of one or more through-holes like that indicated by 31, and subsequently, the metallization of all the uncovered surfaces of the multilayer being in the condition shown in FIG. 4. By this metalization— which gives rise to a layer 18—the cavities 13 obtained through the above described milling operation, have—as shown in FIG. 5—their side surface and their bottom completely metallized, and the outer areas result electrically and thermally connected with the inner metal element or layer 3. Also the inner walls of the through holes 31 result metallized.

Figure 6:
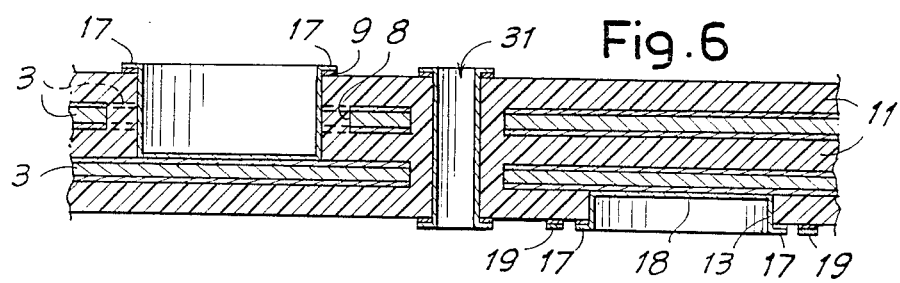
Figure 7:
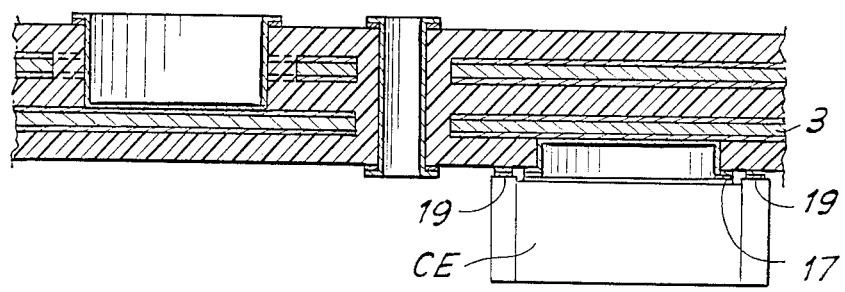
FIGS. 7, 8, 9 and 10 show section views of exmples of multilayers with electronic components whose heat dissipation is achieved according to the method of the invention.

A subsequent step of the method consists in carrying out a photo-engraving of the outer surface (s) of the multilayer 1 or a selective electro-deposition of metals with a subsequent engraving of the copper, thereby obtaining areas, usually in the form of circular rings like that indicated by 17 and 19 (FIG. 6), on which the components CE can be welded or made to rest so that their heat can be dissipated, for example in the disposition of FIG. 7, through the metal layers 3 located inside the multilayer. In order to better help the heat transfer, a metal paste having a good thermal conductivity, can be made to adhere on the base of the component. This paste may also be inserted and distributed on the walls of the metallized cavities thereby further improving the heat transmission.

Figure 8:
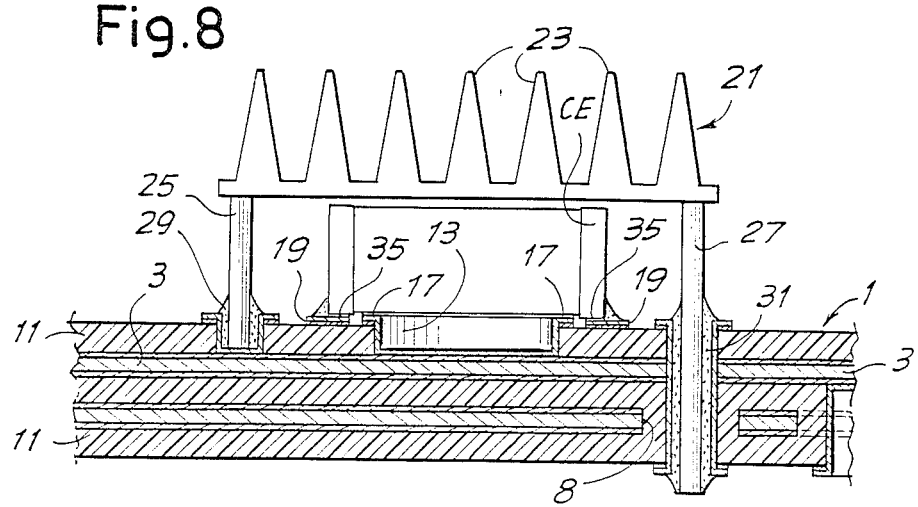
Figure 9:
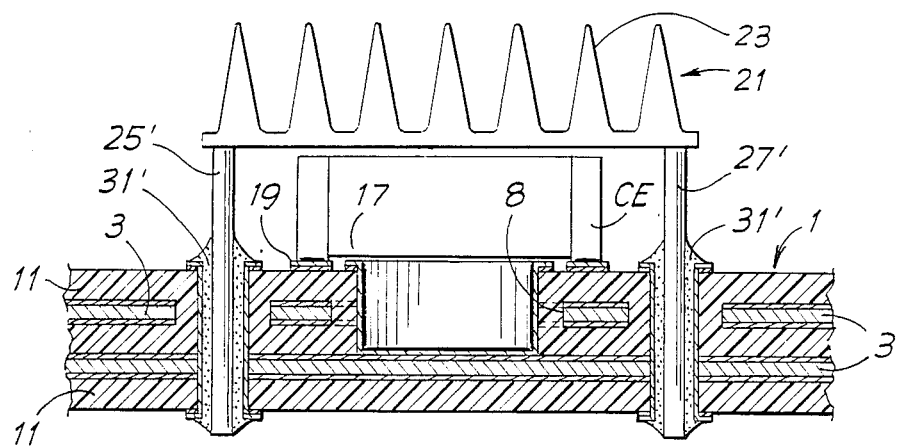
Figure 10:
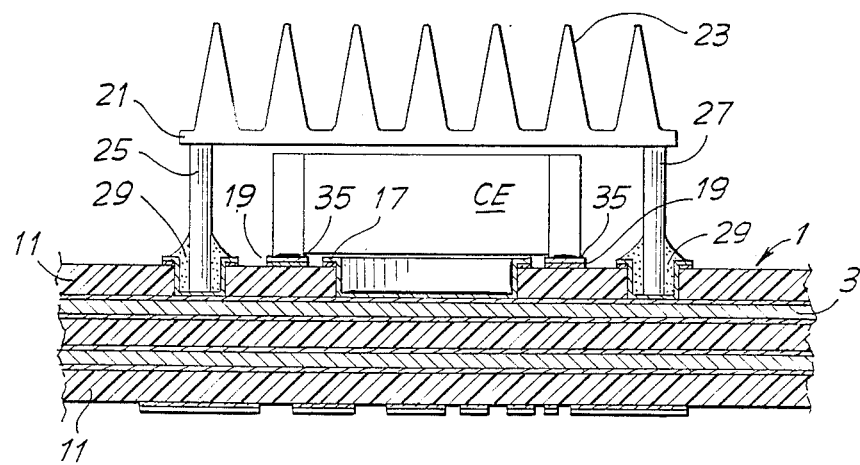

In the condition shown in FIG. 7, the component CE results to be cooled only by the transit of the heat from its base and from the side walls of its lower cylindrical portion to the metal layer 3 with which it is in contact inside the cavity 13, this heat moving along said layer as far as the outside and also being able to dissipate through the other layers of the multilayer. However, and especially for components whose operating functions give rise to a larger amount of heat to be cooled off, the method offers the possibility of transferring said amount of heat to an outer dissipator member, like those indicated by 21 in FIGS. 8 and 9. In the example of FIG. 8, the dissipator member 21, provided with fins 23 to facilitate the air cooling, is equipped with at least two metal rods 25 and 27 solid therewith, the one indicated by 25 being inserted and welded in a metallized cavity 29 similar to the cavity 13 and likewise formed, while the rod 27 is inserted and welded in a metallized through-hole 31; both the cavity 29 and the hole 31 being connected, for heat transfer purposes, with the inner layer 3 which receives heat from the component CE. The cavity like that indicated by 29 and the holes like that indicated by 31 are suitably located around the component or around groups of components. In the example of FIG. 9, the dissipator member 21 results connected with the inner layer 3—which receives heat—through at least two rods 25' and 27' both welded inside the metallized through-holes 31', this solution being preferable as the layer 3 is located further in depth, that is, more spaced than in the case shown in FIG. 8, in respect to the face of the multilayer on which the component is applied. Whereas FIG. 8 shows an example of mixed (so to speak) connection of the element 21 with the layer 3, that is a connection performed in two different ways, in the example of FIG. 10, the rods 25 and 27 are both welded inside cavities 29.

Figure 11:
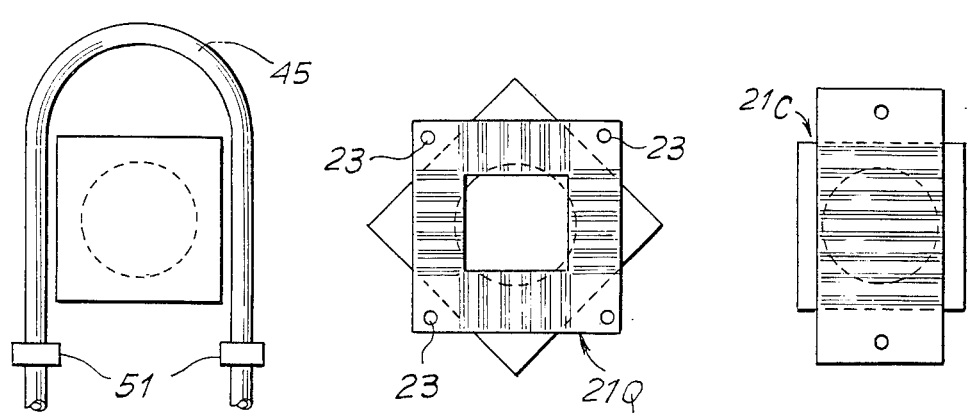
FIGS. 11 and 12 show in respective plan and perspective views, examples of members for the heat dissipation of electronic components through air cooling or a cooling fluid.

It should be noted that the layer 3 is usually a layer having the function to "ground" connect the individual components, which are then connected—according to the circuit diagram, by means of weldings 35—on the portions 19 of the circuit which is printed, that is, photo-engraved on the multilayer after the described metallization step. The dissipator members 21 may be also cooled through forced ventilation; moreover, they may be variously shaped as shown in the examples of FIG. 11 wherein 21C indicates a plan view of an element being rectangular on top, while 21Q indicates a similar view of a square shaped element made up by the union of four straight elements and which has four rods 23 to receive the heat from the layer 3 being in contact with the component base.

Figure 12:
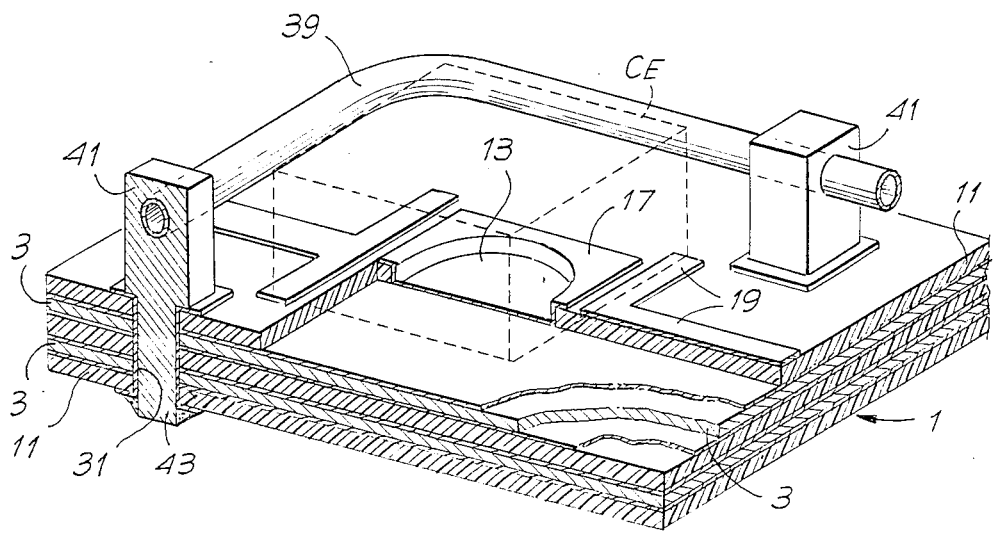

The method provides also for the utilization of external heat dissipators of tubular (or similar) type, internally cooled by water or other cooling fluid. In FIG. 12, a multilayer 1, with a cavity 13 for a parallelepiped component CE, drawn with dotted lines, results cooled by the cooling liquid circulating in the tubing 39. The tubing 39 is supported by and receives the heat from blocks 41 which are provided with lower shanks 43 inserted into metallized through-holes 31 of the multilayer, said shanks receiving the heat from the metal layer 3 on which the component CE rests. The heat dissipator, made up of the two right-angle branches of the tubing 39, is substantially similar to that, made up of a U-shaped tubing 45 borne by blocks 51, shown in plan view on the right in FIG. 11.

The heat dissipation system which results from the invention method is particularly advantageous when multilayers having high dimensional stability like those hereinbefore described are used, in case of possible overheating of the components during their "switch-on/switch-off" operation since, in this case, the components thermally expand in a different way from the base support thereof, that is from the multilayer. Upon the "switch-on/switch-off" operation, a breaking of the so-called "leadless" (that is, without an intermediate lead) weldings of the components may often occur owing to the above said differences in thermal expansion; a good heat dissipation represents, in this case, a radical solution of the problem.

The method of the invention can be obviously applied also to multilayers laminates less valuable, so to speak, than those having high dimensional stability as mentioned in this description, that is, multilayers with at least one metal layer disposed inside the insulating layers, all without particular characteristics of non-deformability. However, in case of multilayers of the type taken into consideration, the method is capable of advantageously integrating their characteristics by broadening the possibilities of use thereof.

It is understood that the drawing shows an exemplification given only as a practical demonstration of the invention, as this may vary in the forms and dispositions without nevertheless departing from the scope of the idea on which the same invention is based.

I claim:

1. A multilayer board for printed circuits comprising in combination at least one metallic layer embedded within layers of insulating material, and in contact with at least one surface of said embedded metallic layer, a layer of a different material disposed at least over predetermined areas of said embedded layer, said different material having physical parameters that are different and distinguishable from the other layers of said board such that engagement of said layer of different material by a cutting tool entering through said insulating material can be detected to interrupt penetration of said tool as soon as said tool strips said different material to expose said embedded layer but before said embedded layer is penetrated by said tool.

2. A multilayer board according to claim 1, wherein said different material is of a character to alter significantly the rotating speed of said tool when said tool is a milling cutter and encounters said different material layer upon entering said board.

3. A multilayer board according to claim 2, wherein said different material consists essentially of a polyimide material.

4. A multilayer board according to claim 1, wherein said different material consists essentially of a polyimide material filled with metallic powder.

5. A multilayer board according to claim 1, wherein said different material consists essentially of a metallic powder in a resin binder.

6. A multilayer board according to claim 5, wherein said resin binder is an epoxy resin.

7. A multilayer board according to claim 1, wherein said layers of insulating material comprise glass fiber reinforced resin where the resin is selected from the group consisting of polyimide resin and epoxy resin, and said metallic layer comprises a layer of INVAR alloy.

8. A multilayer board according to claim 7, wherein said layer of INVAR alloy is clad with copper layers.

9. A multilayer board according to claim 8, wherein said different material is of a character to alter significantly the rotating speed of said tool when said tool is a milling cutter and encounters said different material layer upon entering said board.

10. A multilayer board according to claim 9, wherein said different material consists essentially of a polyimide material.

11. A multilayer board according to claim 8, wherein said different material consists essentially of a polyimide material filled with metallic powder.

12. A multilayer board according to claim 8, wherein said different material consists essentially of a metallic powder in a resin binder.

13. A multilayer board according to claim 12, wherein said resin binder is an epoxy resin.

14. A multilayer board according to claim 7, wherein said different material is of a character to significantly alter the rotating speed of said tool when said tool is a milling cutter and encounters said different material layer upon entering said board.

15. A multilayer board according to claim 14, wherein said different material consists essentially of a polyimide material.

16. A multilayer board according to claim 7, wherein said different material consists essentially of a polyimide material filled with metallic powder.

17. A multilayer board according to claim 7, wherein said different material consists essentially of a metallic powder in a resin binder.

18. A multilayer board according to claim 17, wherein said resin binder is an epoxy resin.

* * * * *